(12) United States Patent
Shum et al.

(10) Patent No.: US 8,884,352 B2
(45) Date of Patent: Nov. 11, 2014

(54) METHOD FOR MANUFACTURING A MEMORY CELL, A METHOD FOR MANUFACTURING A MEMORY CELL ARRANGEMENT, AND A MEMORY CELL

(71) Applicant: Infineon Technologies AG, Neubiberg (DE)

(72) Inventors: Danny Shum, Poughkeepsie, NY (US); Christoph Bukethal, Dresden (DE); Martin Stiftinger, Stockdorf (DE); John Power, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/646,797

(22) Filed: Oct. 8, 2012

(65) Prior Publication Data
US 2014/0097480 A1 Apr. 10, 2014

(51) Int. Cl.
*H01L 27/115* (2006.01)

(52) U.S. Cl.
USPC ........................................................ 257/314

(58) Field of Classification Search
USPC ................................................. 438/201, 591
See application file for complete search history.

(56) References Cited

U.S. PATENT DOCUMENTS

| 6,492,675 | B1 | 12/2002 | Van Buskirk et al. | |
|---|---|---|---|---|
| 7,433,232 | B2 | 10/2008 | Geissler et al. | |
| 7,611,941 | B1 * | 11/2009 | Shum et al. | 438/201 |
| 2009/0059678 | A1 | 3/2009 | Strenz et al. | |
| 2011/0070725 | A1 * | 3/2011 | Power et al. | 438/591 |
| 2011/0070726 | A1 * | 3/2011 | Dickenscheid et al. | 438/591 |

OTHER PUBLICATIONS

Kume et al., "A Flash-erase EEPROM cell with asym. S/D structure", IEDM p. 560-563, 1987.

* cited by examiner

*Primary Examiner* — Matthew W Such
*Assistant Examiner* — Warren H Kilpatrick

(57) ABSTRACT

A method for manufacturing a memory cell in accordance with various embodiments may include: forming at least one charge storing memory cell structure over a substrate, the charge storing memory cell structure having a first sidewall and a second sidewall opposite the first sidewall; forming an electrically conductive layer over the substrate and the charge storing memory cell structure; patterning the electrically conductive layer to form a spacer at the first sidewall and a blocking structure at the second sidewall of the charge storing memory cell structure; implanting first dopant atoms to form a first doped region in the substrate proximate the spacer, wherein the first dopant atoms are blocked by the blocking structure; removing the blocking structure after implanting the first dopant atoms; implanting second dopant atoms to form a second doped region in the substrate proximate the second sidewall of the charge storing memory cell structure.

24 Claims, 10 Drawing Sheets

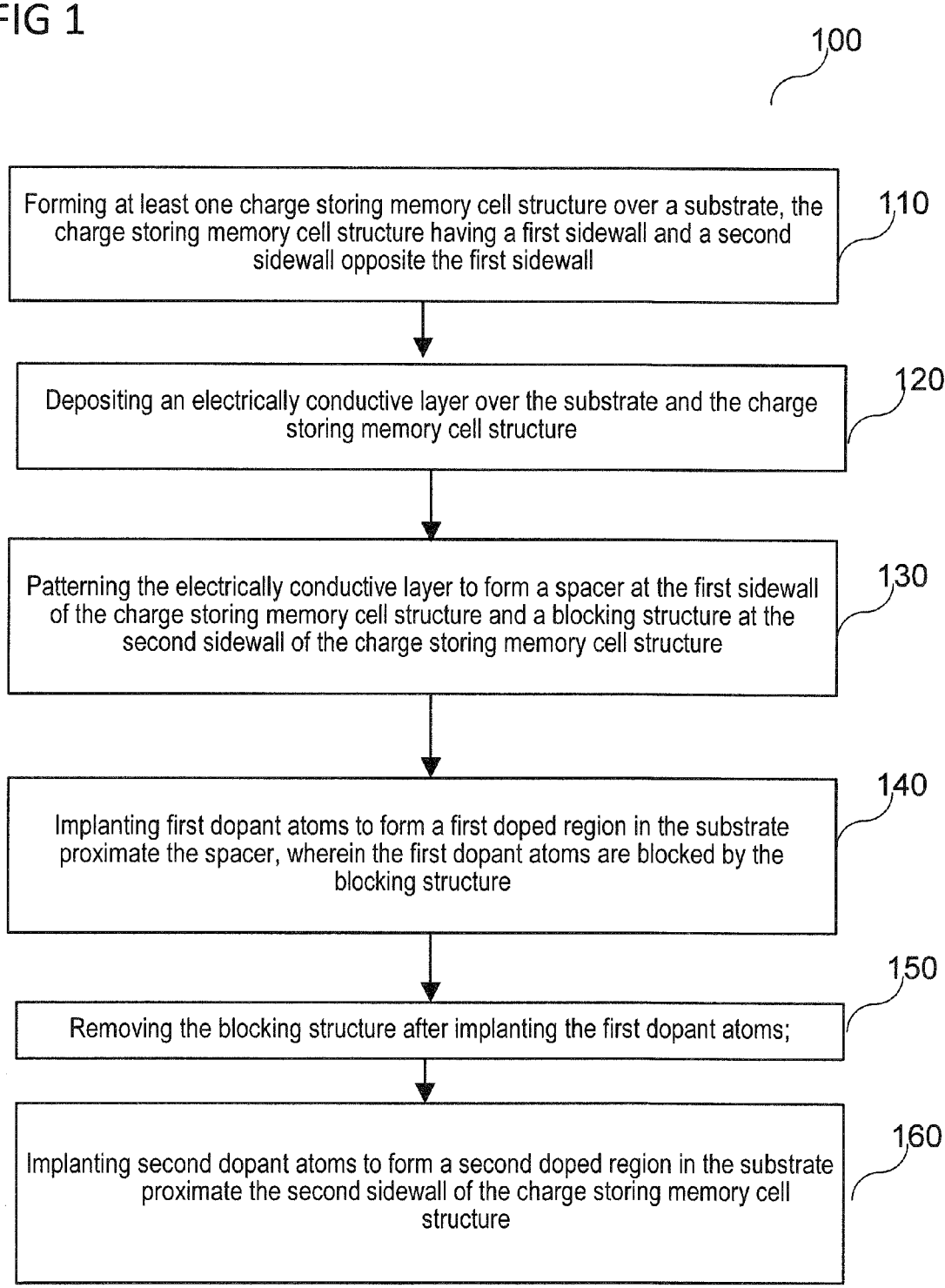

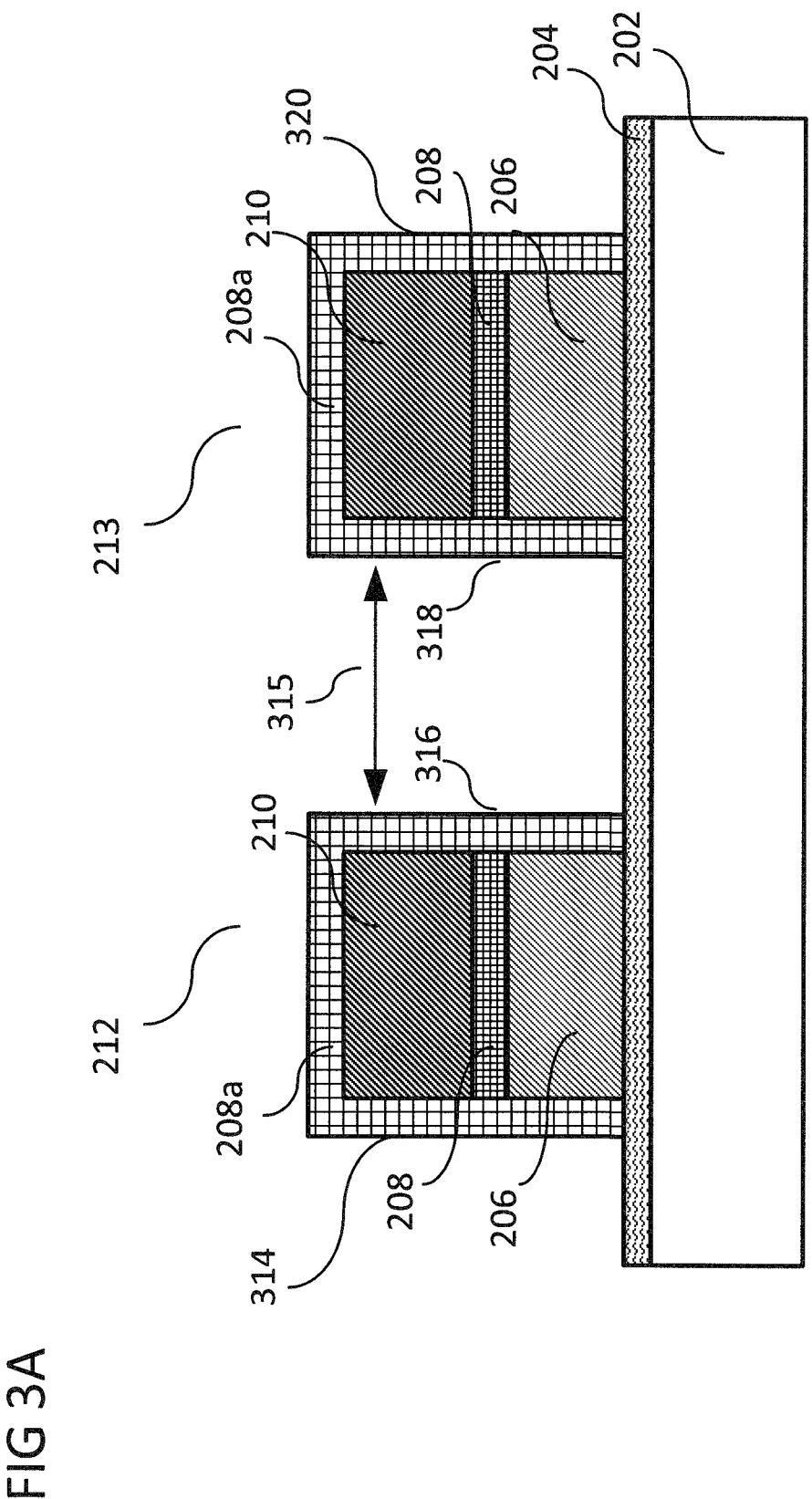

METHOD FOR MANUFACTURING A MEMORY CELL, A METHOD FOR MANUFACTURING A MEMORY CELL ARRANGEMENT, AND A MEMORY CELL

TECHNICAL FIELD

Various embodiments relate generally to a method for manufacturing a memory cell, a method for manufacturing a memory cell arrangement, and a memory cell.

BACKGROUND

Memory cells such as, for example, flash memory cells may be used to store data. One type of flash memory cell is a split-gate flash memory cell, which may include a spacer (e.g. poly spacer) as a select gate (SG) in addition to a gate stack (e.g. double poly stack) including a floating gate (FG) and a control gate (CG) of the memory cell. For this type of memory cell, it may be desirable to improve or optimize the formation of source/drain junctions in order to achieve fast programming (abrupt junction) while avoiding short channel effects. For example, formation of lightly doped (LDD) junctions in the memory cell may reduce short channel effects.

Improving or optimizing source/drain junction formation may include using separate implants for the source/drain junctions. For separate source/drain junction implants, conventional methods may include adding two highly critical masks, which may have to be aligned to the gate patterning by either blocking the source side or the drain side of the cell.

SUMMARY

A method for manufacturing a memory cell in accordance with various embodiments may include: forming at least one charge storing memory cell structure over a substrate, the charge storing memory cell structure having a first sidewall and a second sidewall opposite the first sidewall; depositing an electrically conductive layer over the substrate and the charge storing memory cell structure; patterning the electrically conductive layer to form a spacer at the first sidewall of the charge storing memory cell structure and a blocking structure at the second sidewall of the charge storing memory cell structure; implanting first dopant atoms to form a first doped region in the substrate proximate the spacer, wherein the first dopant atoms are blocked by the blocking structure; removing the blocking structure after implanting the first dopant atoms; implanting second dopant atoms to form a second doped region in the substrate proximate the second sidewall of the charge storing memory cell structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIG. 1 shows a method for manufacturing a memory cell in a flow diagram in accordance with various embodiments;

FIG. 3A schematically shows a cross section of a substrate at a processing stage, wherein two charge storing memory cell structures are formed over the substrate, in analogy to FIG. 2B, in accordance with various embodiments;

DESCRIPTION

Figure 2A:
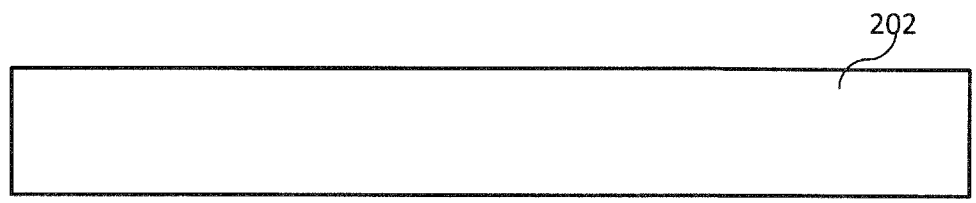
FIG. 2A schematically shows a cross section of a substrate at an initial processing stage in accordance with various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various aspects of the disclosure are provided for methods, and various aspects of the disclosure are provided for devices. It will be understood that basic properties of the methods also hold for the devices and vice versa. Therefore, for sake of brevity, duplicate description of such properties may be omitted.

The term "at least one" as used herein may be understood to include any integer number greater than or equal to one.

The term "a plurality of" as used herein may be understood to include any integer number greater than or equal to two.

The terms "disposed over", "applied over" or "formed over" as used herein are intended to include arrangements where a first element or layer may be disposed, applied or formed directly on a second element or layer with no further elements or layers in-between, as well as arrangements where a first element or layer may be disposed, applied or formed above a second element or layer with one or more additional elements or layers between the first element or layer and the second element or layer.

A "non-volatile memory cell" may be understood as a memory cell storing data even if it is not active. In an embodiment of the invention, a memory cell may be understood as being not active e.g. if currently access to the content of the memory cell is inactive. In another embodiment, a memory cell may be understood as being not active e.g. if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

Implanting dopant atoms may be used herein equivalent with the meaning implanting dopant ions, implanting a dopant material, or implanting a dopant.

Fabricating a memory cell as well as an arrangement of memory cells may be a complex issue, since a plurality of processes may be involved. Reducing the number of process steps may be one approach to optimize the fabrication process, which may lower the costs, e.g. due to a faster processing, and may increase the yield, e.g. due to higher reproducibility. The scalability of memory cells on a memory chip, like flash memory, may be a central issue, since the relatively simple structure of memory chips and the high demand for higher capacity pushes the development to a smaller design rule. Reducing the size of the memory chips may come along with reducing the size of the junction, e.g. in Flash memory cells, which may initially lead to a higher performance and yield, but reaching a critical dimension contrary effects may reduce the quality of the junction.

The majority of non-volatile memory cells like EEPROM (Electrically Erasable Programmable Read Only Memory) or flash memory cells may include one or more field effect transistors (e.g. Metal Oxide Semiconductor Field Effect Transistors, MOSFETs) as a charge storage transistor (e.g. a floating gate transistor or a charge trapping transistor), therefore, this type of memory cell may also be referred to as charge storage memory cell. The floating-gate of a conventional floating-gate transistor may be provided by conducting material surrounded by electrically isolating material (insulating material), e.g. conductive polycrystalline silicon surrounded by silicon oxide. Furthermore, the charge trapping region of a conventional charge trapping transistor may include a so called MONOS (Metal-Oxide-Nitride-Oxide-Silicon) structure including an electrically isolating material, e.g. silicon nitride, e.g. a stack of silicon oxide-silicon nitride-silicon oxide. Since the information in a memory cell may be stored electrically by bringing a certain amount of charge (usually electrons) into a charge storing portion (e.g. a floating gate or a charge trapping region), these memory cells may also be referred to as charge storing memory cells. Further, split-gate memory cells have been developed including an additional select gate which may be created for instance using a spacer structure. Fabricating charge storage based memory cells usually may include the implantation of a dopant (doping material) providing doped regions, e.g. source region and drain region, forming one or more (pn or np) junctions with the so called body region. The optimization of such junctions having a separated source side and drain side may result in a faster response time (switching time or programming time) of the memory cell, influenced by the channel length, but at the same time avoiding short channel effects. Therefore, shallow junctions or junctions with thin or ultra-thin channels may be introduced, so that the ratio between channel length and thickness may be optimized (typically a junction is called short junction, if the channel length is smaller than the thickness). Problems may arise during fabrication of shallow junctions due to ion implantation damage of light ions, like boron ions, having low energies to enable the formation of a shallow doping region, since ions with low-energy are subjected to the domination of electronic stopping entering a solid-state material. A further possibility to optimize junctions may be the use of asymmetrical junctions. The design of so called LDD-junctions (lightly doped drain-junctions) may reduce short channel effects. Also non-uniform channel doping (halo doping) may be a possibility to optimize the scalability of the junction due to reverse short-channel effect (RSCE).

Fabrication of floating gate based memory cells including asymmetrical source region and drain region may require more than one masking process and implantation process to generate at least one source region and at least one drain region, e.g. implanting the at least one source region using a first masking process and implanting the at least one drain region using a second masking process, wherein the masking processes may include for example the application of (hard) mask material and photo resist material and patterning the mask material using lithographic and etching processes, respectively. Therefore, misalignment and overlay errors may be an issue during the fabrication of the drain and source regions of an asymmetrical junction, which may cause problems during scaling of the memory cells.

In various embodiments, an optimized process for fabricating a charge storing memory cell and an optimized process for manufacturing an array of charge storing memory cells is provided.

According to various embodiments, FIG. 1 shows in a flow diagram a method 100 for manufacturing a memory cell, wherein the method for manufacturing at least one memory cell may include, in 110, forming at least one charge storing memory cell structure over a substrate, the charge storing memory cell structure having a first sidewall and a second sidewall opposite the first sidewall. In 120, an electrically conductive layer may be deposited over the substrate and the charge storing memory cell structure, followed by 130, wherein the electrically conductive layer may be patterned forming a spacer at the first sidewall of the charge storing memory cell structure and a blocking structure at the second sidewall of the charge storing memory cell structure. In 140, implanting first dopant atoms forming a first doped region in the substrate proximate the spacer may be provided, wherein the first dopant atoms are blocked by the blocking structure and subsequently, in 150, the blocking structure may be removed after implanting the first dopant atoms. Finally, in 160, implanting second dopant atoms forming a second doped region in the substrate proximate the second sidewall of the charge storing memory cell structure may be provided.

FIG. 2A schematically shows a cross section of a substrate 202 at an initial processing stage in accordance with various embodiments. According to various embodiments, the substrate (e.g. a carrier or a wafer substrate) may be made of semiconductor materials of various types, including silicon, germanium, Group III to V or other types, including polymers, for example, although in another embodiment of the invention, also other suitable materials can be used. In an embodiment, the substrate is made of silicon (doped or undoped), in an alternative embodiment, the substrate is silicon on insulator (SOI) wafer. As an alternative, any other suitable semiconductor material can be used for the substrate, for example semiconductor compound material such as gallium arsenide (GaAs), indium phosphide (InP), but also any suitable ternary semiconductor compound material or quaternary semiconductor compound material such as indium gallium arsenide (InGaAs).

As described above with reference to method 100, at least one charge storing memory cell structure may be formed over the substrate 202 in a first process 110 according to various embodiments. The at least one charge storing memory cell structure may be a part of a charge storing based memory cell, e.g. a single-level or multi-level charge storing memory cell or e.g. a single bit or multi bit charge storing memory cell, e.g. a split-gate charge storing memory cell, e.g. a split-gate floating gate memory cell or a split-gate charge trapping memory cell, e.g. an asymmetrical source/drain floating gate memory cell, e.g. a so called 1T-UCP (one transistor uniform channel program) floating gate memory cell, e.g. a 1.5T-UCP floating gate memory cell, e.g. an ETOX® floating gate memory cell.

Figure 2B:
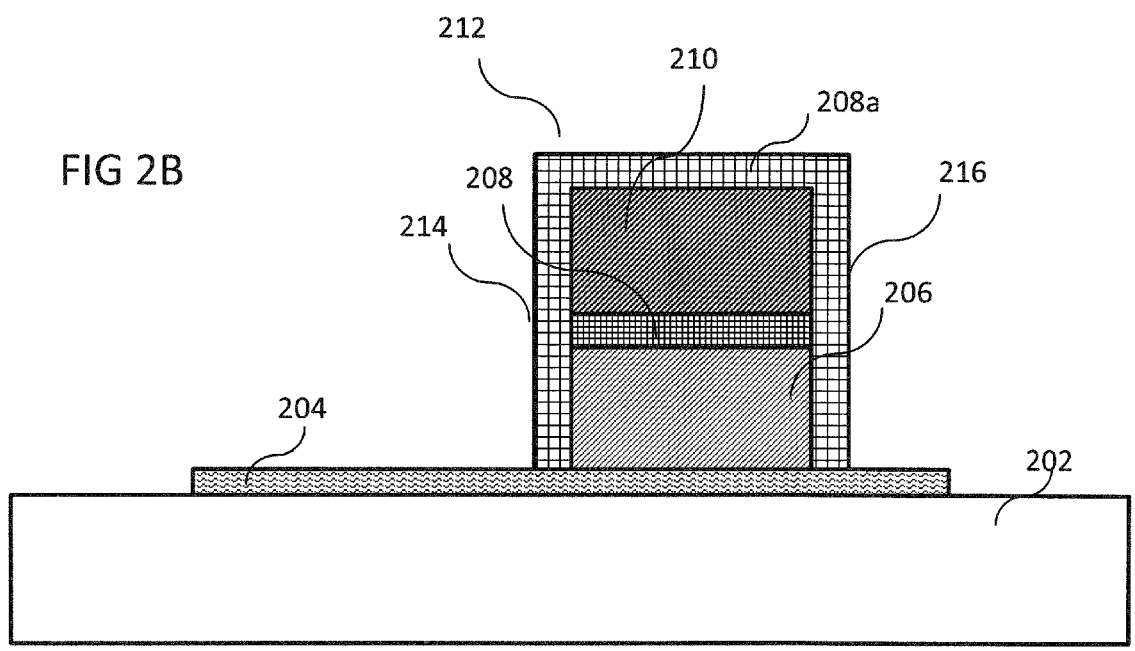
FIG. 2B schematically shows a cross section of a substrate at a first processing stage, wherein a charge storing memory cell structure is formed over the substrate in accordance with various embodiments.

FIG. 2B schematically shows a cross section of the substrate 202 at a first processing stage, wherein a charge storing memory cell structure 212 is formed over the substrate 202 in accordance with various embodiments. As shown in FIG. 2B, the charge storing memory cell structure 212 may be formed over the substrate 202 including a first insulating layer 204 formed over the substrate 202, a charge storage layer 206 (e.g. a floating gate or a charge trapping structure) formed over first insulating layer 204, a second insulating layer 208 formed over the charge storage layer 206, a control gate layer 210 (e.g. a control gate) formed over second insulating layer 208, and forming a third insulating layer 208a completely covering the underlying structure.

According to one or more embodiments, the first insulating layer 204 may, for example, have a thickness in the range from about 6 nm to about 14 nm, for example about 10 nm in one embodiment.

According to one or more embodiments, the charge storage layer 206 may, for example, have a thickness in the range from about 50 nm to about 150 nm, for example about 80 nm in one embodiment.

According to one or more embodiments, the second insulating layer 208 may, for example, have a thickness in the range from about 10 nm to about 18 nm, for example about 14 nm in one embodiment.

According to one or more embodiments, the control gate layer 210 may, for example, have a thickness in the range from about 50 nm to about 150 nm, for example about 100 nm in one embodiment.

According to various embodiments, the third insulating layer 208a may, for example, have a thickness in the range from about 15 nm to about 22 nm, for example about 19 nm in one embodiment.

In more detail, the first insulating layer 204 formed over substrate 202 defines a channel region of the floating gate memory cell structure, e.g. by forming a tunnel oxide layer between the substrate 202 and the charge storage layer 206. The first insulating layer 204 may be deposited using deposition processes as for example atomic layer deposition (ALD), chemical vapor deposition (CVD), low pressure CVD (LPCVD), ultrahigh vacuum CVD (UHVCVD), or physical vapor deposition (PVD), e.g. sputtering. According to various embodiments, first insulating layer 204 may be formed by oxidation of the substrate material 202, e.g. by thermal oxidation of a silicon substrate resulting in a silicon oxide layer on the substrate surface, wherein, for example, the oxidation process may be performed at a temperature between 800° C. and 1200° C. According to various embodiments, the first insulating layer 204 may be formed completely over the surface of the substrate 202 or over a portion of the substrate 202. Further, the material forming the first insulating layer 204 may include at least one material of the following group of materials or a layer stack including a plurality of layers each having at least one material of the following group of materials: one or more electrical isolators, e.g. one or more insulating oxides such as e.g. silicon oxide or aluminium oxide, one or more insulating nitrides, e.g. silicon nitride.

Further, the charge storage layer 206 formed over the first insulating layer 204 may be deposited using commonly applied deposition processes as described before. In accordance with various embodiments, the charge storage layer 206 may be configured as a floating gate layer, e.g. by depositing a layer of polycrystalline silicon over the first insulating layer 204. Polycrystalline silicon is also referred to as polysilicon. In accordance with an alternative embodiment, the charge storage layer 206 may be configured as a charge trapping layer, e.g. by depositing a nitride layer over first insulating layer 204 which may be part of an oxide-nitride-oxide (ONO) layer stack. According to various embodiments, the charge storage layer 206 may be a layer of nanocrystalline material, e.g. nanocrystalline silicon.

According to various embodiments, the second insulating layer 208 formed over the charge storage layer 206 may be deposited using commonly applied deposition processes as for example ALD, CVD, LPCVD, UHVCVD, or PVD. Further, the material forming the second insulating layer 208 may include at least one material of the following group of materials or a layer stack including a plurality of layers each having at least one material of the following group of materials: electrical isolators, e.g. insulating oxides such as silicon oxide or aluminum oxide, insulating nitrides, e.g. silicon nitride.

According to various embodiments, the control gate layer 210 may subsequently be formed over the second insulating layer 208. The control gate layer 210 may be deposited using deposition processes as described before, e.g. depositing polycrystalline silicon.

Finally, the structure including the charge storage layer 206 and the control gate layer 210 as well as second insulating layer 208 may be covered with insulating material forming third insulating layer 208a (e.g. coated using a deposition process providing a sufficiently high edge coverage as for example ALD, LPCVD, furnace, RTO, ISSG), resulting in the charge storing memory cell structure 212 as schematically shown in FIG. 2B. Further, the insulating material forming the third insulating layer 208a may include at least one material of the following group of materials: electrical isolators, e.g. insulating oxides such as silicon oxide or aluminum oxide, insulating nitrides, e.g. silicon nitride. The third insulating layer 208a (e.g. the oxide layer) may serve to insulate select structures (select gates) to be formed later (cf. FIG. 2C), from the charge storing memory cell structure 212 and from the substrate 202. An electrically insulating layer 208a configured as an oxide layer may thus also be referred to as select gate oxide layer. According to various embodiments, third insulating layer 208a may also at least partially cover the surface of the substrate 202 adjacent to the charge storing memory cell structure 212, or may cover at least partially the substrate 202, and accordingly at least partially the first insulating layer 204 as well (not shown in the Figures).

According to various embodiments, forming the charge storage layer 206, the control gate layer 210, and insulating layers 204, 208, 208a and therefore also forming the charge storing memory cell structure 212 may include, without limitation, patterning processes, such as applying mask material (e.g. spin coating of photoresist or depositing hard mask material, e.g. a nitride), patterning the mask material (e.g. using a lithographic process, e.g. photolithography), and removing part of the mask material (e.g. partially removing photoresist or partially removing hard mask material, e.g. by using a lithographic pattern process).

According to various embodiments, the charge storage layer 206 (floating gate layer) and the control gate layer 210 are provided by layers of polycrystalline silicon, e.g. electrically conducting (doped) polycrystalline silicon, which results in a so-called double poly stack, herein described as a charge storing memory cell structure 212. The charge storing memory cell structure 212 as shown in FIG. 2B has a first sidewall 214 and a second sidewall 216, wherein due to the symmetry, the sidewalls may be identical. Therefore, the assignment first and second sidewall is arbitrary. According to various embodiments, the first sidewall 214 and the second sidewall 216 may run parallel to each other, or may have a small deviance from being parallel to each other, and may be aligned perpendicular to the surface of the substrate 202, or may have a small variance from being perpendicular to the surface of the substrate 202.

The structure elements of the charge storing memory cell structure 212, that means charge storage layer 206 (e.g. floating gate layer or charge trapping layer), control gate layer 210, and insulating layers 204, 208, 208a may each be formed in a single deposition process respectively, according to various embodiments. Further, the elements of the charge storing memory cell structure 212 may each include a plurality of layers, e.g. an additional layer formed over a structure element, or may be composed of separate layers respectively, e.g. a structure element may be composed of different materials, according to various embodiments.

Further, as described above with reference to method 100 as shown in FIG. 1, an electrically conductive layer may be formed over the charge storing memory cell structure 212 in a second process 120 followed by a third process 130, wherein during the third process 130, the electrically conductive layer may be patterned forming a spacer at the first sidewall 214 of the charge storing memory cell structure 212 and a blocking structure at the second sidewall 216 of the charge storing memory cell structure, according to various embodiments.

Figure 2C:
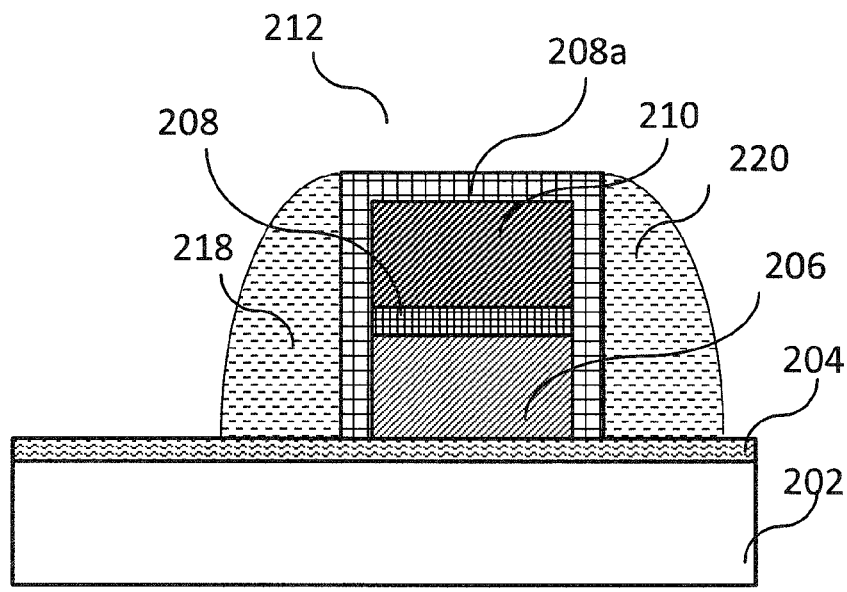
FIG. 2C schematically shows a cross section of a substrate at a second processing stage, wherein a spacer and a blocking structure are formed at the sides of the charge storing memory cell structure in accordance with various embodiments.

According to various embodiments, FIG. 2C schematically shows a cross section of the memory cell at a second processing stage, after the second process 120 and the third process 130 have been performed, with reference to method 100 illustrated in FIG. 1. As shown in FIG. 2C, a spacer 218 (e.g. a select gate) is formed at the first sidewall 214 and a blocking structure 220 is formed at the second sidewall 216 of the charge storing memory cell structure 212, after the second process 120 and the third process 130 have been executed. According to various embodiments, the spacer 218 and the blocking structure 220 may, for example, be formed by a deposition process, e.g. a conformal deposition process (ALD, LPCVD), of a spacer material (in second process 120) followed by an etch process (e.g., an anisotropic etch process, e.g. a reactive ion etch (RIE) process) of the spacer material (in the third process 130). According to various embodiments, the spacer material may include at least one material of the following group of (electrically conductive) materials: polycrystalline silicon (doped to be electrically conductive), a metal nitride (e.g. titanium nitride), a metal, carbon. According to various embodiments, the spacer 218 may serve as a select gate in the charge storing memory cell, and the blocking structure 220 may serve for blocking ions during an implantation process (e.g. during fourth process 140 as described in FIG. 1), as will be described in more detail further below.

According to various embodiments, the charge storing memory cell structure 212, e.g. the double poly stack, may be a part of a charge storing flash memory cell as shown in FIG. 2C, schematically illustrating a possible architecture of a sidewall spacer split-gate flash memory cell. Further, if the sidewall spacer may include polycrystalline silicon as well, the sidewall spacer split-gate flash memory cell may be a so-called HS3P-cell (Hot Source 3-Poly cell), whereby 3-Poly refers to the fact, that the three basic components, namely the floating gate, the control gate, and the select gate, are formed by portions of polycrystalline silicon and the term "hot source" refers to the charging process of the floating gate (the programming of the memory cell) using hot electrons. The electrical properties of polycrystalline silicon may be adjusted to a specific desired behavior, starting from a semiconducting behavior by adding doping material resulting in a metallic behavior. The discharging (erasing) of the floating gate may be realized using the Fowler-Nordheim (FN) erase mechanism, in which a memory cell may be erased by tunneling of charge carriers (e.g., electrons) from the floating gate through the first insulating layer 204 (e.g. a tunnel oxide) to the channel of the charge storing memory cell.

For operating a charge storing memory cell (e.g. a floating gate based memory cell) in general a source region and a drain region forming a junction is provided. According to various embodiments, regions of doped material, e.g. substrate material, may be formed therefore providing a source region and a drain region, e.g. by doping the substrate material using implantation of atoms or ions into the substrate. According to various embodiments, the implantation of atoms or ions may be carried out after that the deposition of first insulating layer 204, wherein the kinetic energy (implant energy) of the dopant ions may be chosen in that range, that the penetration depth of the ions is larger than the thickness of first insulating layer 204 (e.g. the tunnel oxide layer). For generating a p-type region (where holes dominating the charge transport) p-type dopants such as e.g. boron ions or aluminum ions may be implanted into the substrate 202 (e.g. the silicon substrate). For generating an n-type region (where electrons dominating the charge transport) n-type dopants such as e.g. phosphorus, arsenic, or antimony ions may be implanted into the substrate 202 (e.g. the silicon substrate).

Figure 2D:
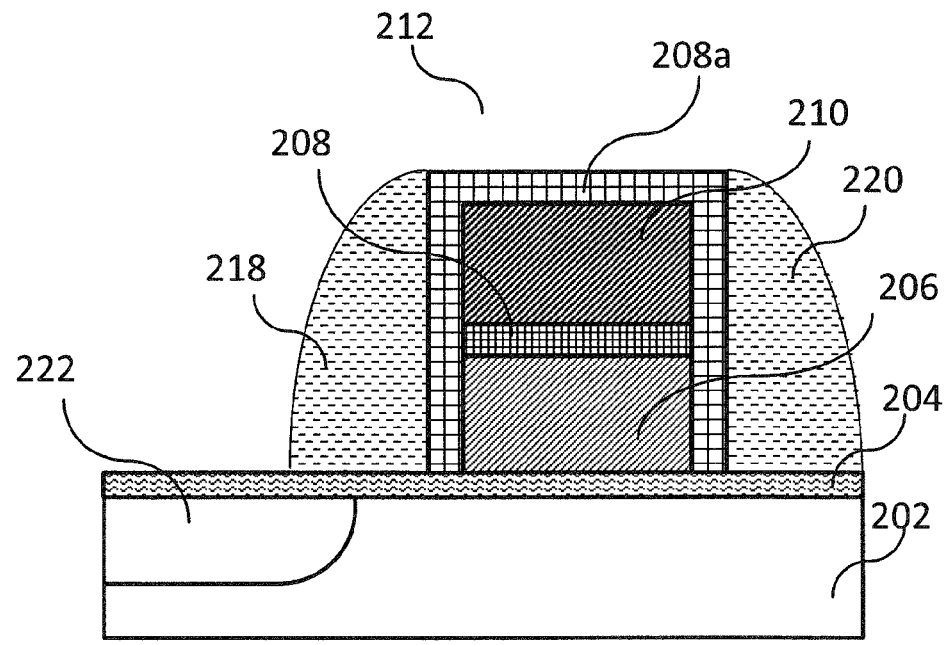
FIG. 2D schematically shows a cross section of a substrate at a third processing stage, wherein the first doped region is generated in the substrate in accordance with various embodiments.

According to various embodiments, FIG. 2D schematically illustrates a cross section of the memory cell at a third processing stage, after the fourth process 140 is performed, with reference to method 100 illustrated in FIG. 1. As shown in FIG. 2D, a first dopant may be implanted into the substrate 202, self-aligned to the poly spacer 218, thereby forming a first doped region 222. According to various embodiments, the first doped region 222 may form the drain region of the junction. According to various embodiments, the first doped region 222 (e.g. the drain region) may be a p-type or an n-type doped region. According to various embodiments, the first doped region 222 (e.g. the drain region) may include more than one region or a plurality of areas, wherein the regions or areas may differ in at least one of the doping type (p-type or n-type), the doping concentration, the dose, and the shape of the doped region or area. According to various embodiments, the drain region may be lightly doped. In one or more embodiments, a doping concentration may, for example, be in the range from about $10^{18}$ cm$^{-3}$ to about $10^{19}$ cm$^{-3}$, although other values may be possible as well in accordance with other embodiments. Accordingly, the drain region may also be a lightly doped p-type region. It should be mentioned, that using lightly doped drain regions (LDD) may improve the performance of the junction due to reducing short channel effects. Further, as already described, the formation of the first doped region 222 (e.g. the drain region) may be achieved without using a masking process, which is beneficial (a reduced number of process steps) compared to commonly used methods, since these commonly used methods may need an additional masking process to form the doped regions of the junctions. According to various embodiments, the blocking structure 220 may prevent that ions penetrate the substrate through the blocking structure 220 during implanting the first dopant atoms. In other words, the first dopant atoms are blocked by the blocking structure 220 from the substrate 202. Furthermore, the formation of the first doped region 222 (e.g. the drain region) may be self-aligned to the spacer 218, since no masking process is necessary, which is beneficial regarding the scaling of the charge storing memory cell. That means smaller charge storing memory cells can be fabricated, since overlay errors during the formation the doped regions, e.g. first doped region 222 (e.g. the drain region), may be reduced. Moreover, due to the nature of the spacer shape, e.g. the shape of the spacer 218, the implant damage to the select gate oxide (e.g. first insulating layer 204 approximating the spacer 218) resulting from implanting ions through the gate oxide (e.g. first insulating layer 204) may be reduced.

Figure 2E:
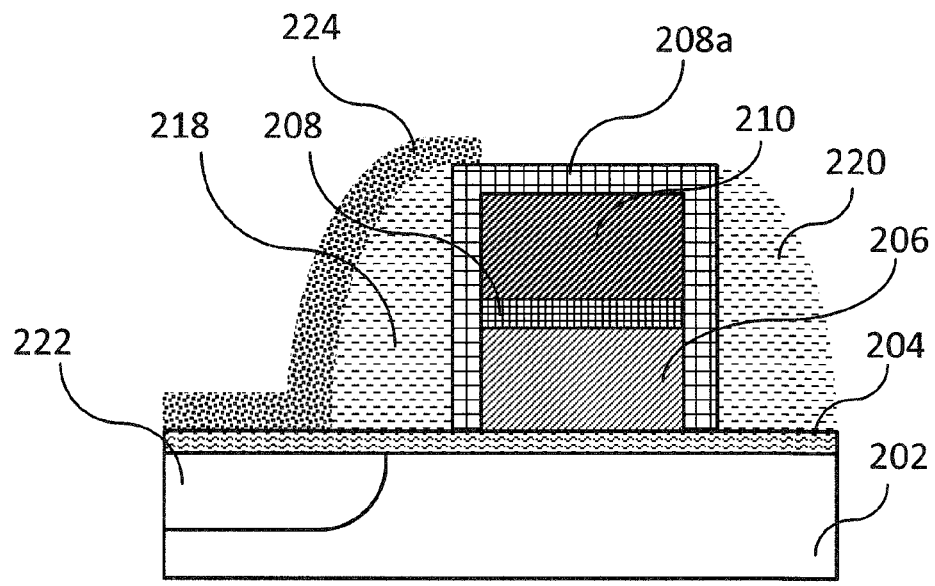
FIG. 2E schematically shows a cross section of a substrate at a fourth processing stage, wherein mask material is applied over at least the first doped region in accordance with various embodiments.

As described above with reference to method 100, after implantation of the first dopant atoms the blocking structure 220 may be removed in a fifth process 150 according to various embodiments. Therefore, a masking process may be performed including for instance applying mask material, e.g. spin coating of a photoresist, patterning the mask material, e.g. using photolithography, exposing the surface of the blocking structure 220. According to various embodiments, after the masking process is performed the blocking structure 220 may be removed, e.g. using an etch process (e.g. an anisotropic etch process). According to various embodiments, applying mask material may include the deposition of a hard mask material e.g. depositing a layer of silicon nitride or silicon oxide, and subsequently patterning the hard mask material. According to various embodiments, the hard mask material may cover the spacer 218 and first doped region 222 completely and may at least partially cover the charge storing memory cell structure 212, as shown in FIG. 2E.

Figure 2F:
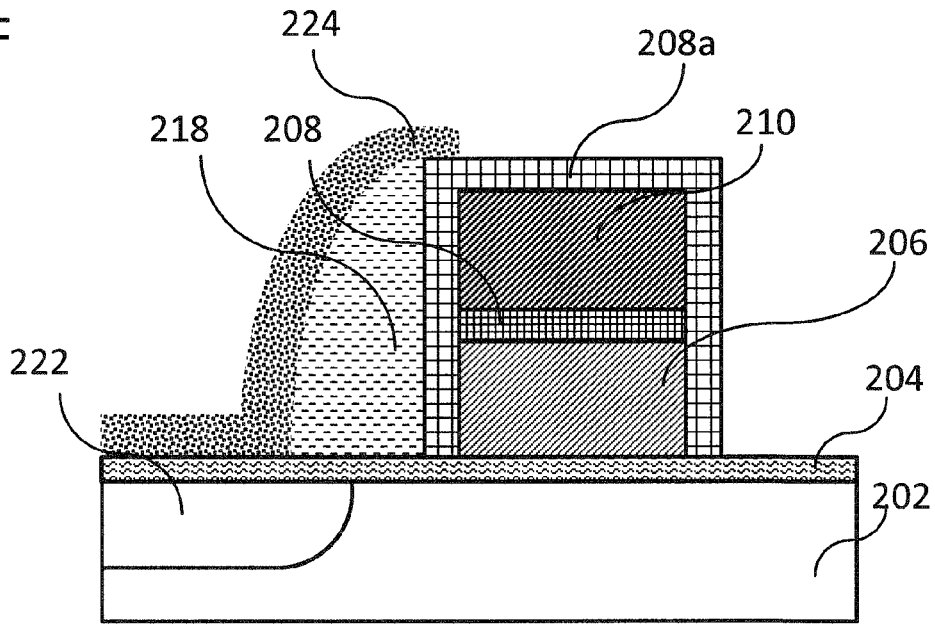
FIG. 2F schematically shows a cross section of a substrate at a fifth processing stage, wherein the blocking structure is removed in accordance with various embodiments.

Since the blocking structure 220 is partially surround by the third insulating layer 208a, the third insulating layer 208a may be used as a removal structure in accordance with various embodiments. According to various embodiments, the third insulating layer 208a may be, for example, silicon oxide, and therefore it may be sufficient covering the spacer 218 with a mask material 224, e.g. a resist (photoresist), e.g. a hard mask material, as shown in FIG. 2E. In this regard, covering at least partially other surfaces than the surface of spacer 218, e.g. insulating layers 204, 208a, may be possible. According to various embodiments, the drain side of the charge storing memory cell structure 212 may be covered with the mask material 224, wherein the drain side includes the spacer 218 and the region over the substrate 202, where the first doped region 222 (the drain region) is located underneath. The blocking structure 220 may finally not be covered with mask material at this processing stage, since then, the removal of the blocking structure 220 would be more complicated. As illustrated in FIG. 2F, after covering spacer 218 (after covering the drain side) an etch process may be carried out removing the blocking structure 220 according to various embodiments. Further, the etch process may be a highly selective etch process (e.g. dry etching, e.g. wet etching) removing the blocking structure 220 (e.g. formed of polycrystalline silicon), but not etching away (or removing completely) the third insulating layer 208a, e.g. an oxide layer (silicon oxide), and also not etching away (or removing completely) the first insulating layer 204, e.g. an oxide layer (silicon oxide). According to various embodiments, the combination of materials used forming the blocking structure 220 and the insulating layers 208a and 204 may be chosen, so that insulating layers 204, 208a can be used as a removal of structure, that means that the blocking structure 220 can be removed without completely affecting (etching away or removing completely) insulating layers 204, 208a.

Figure 2G:
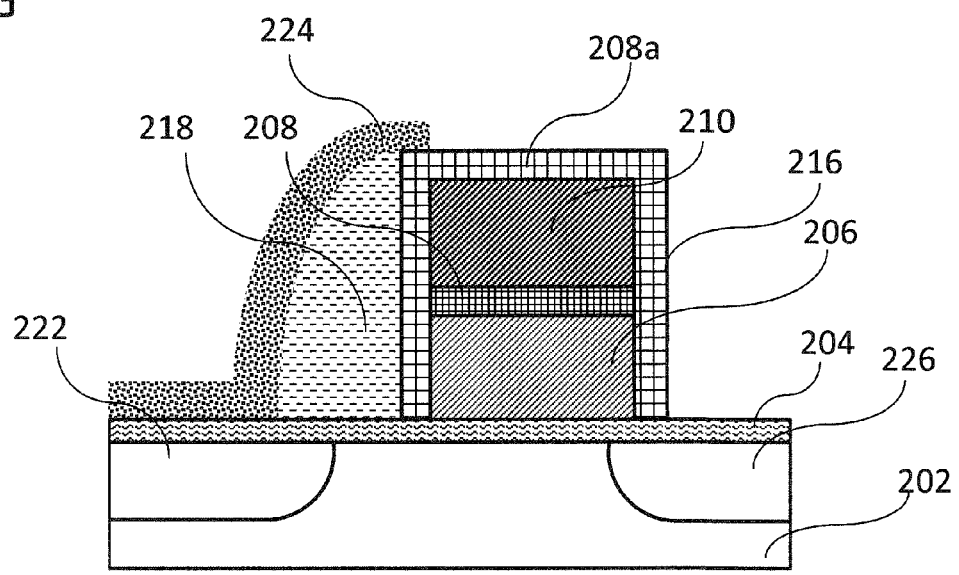
FIG. 2G schematically shows a cross section of a substrate at a final processing stage, wherein the second doped region is generated in the substrate in accordance with various embodiments.

As described above with reference to method 100, after removing the blocking structure 220 second dopant atoms may be implanted in the substrate 202, thereby forming a second doped region proximate the second sidewall 216 of the charge storing memory cell structure 212 in a sixth process 160 according to various embodiments. As shown in FIG. 2G, a second dopant is implanted in the substrate 202, thereby forming a second doped region 226 proximate the second sidewall 216. According to various embodiments, the second doped region 226 may form the source region of the junction. According to various embodiments, the second doped region 226 (e.g. the source region) may be a p-type or an n-type doped region. According to various embodiments, the second doped region 226 (e.g. the source region) may include more than one region or a plurality of areas, wherein the regions or areas may differ in at least one of the doping type (p-type or n-type), the doping concentration, the dose, and the shape of the doped region or area.

According to various embodiments, mask material 224 covering the drain region and third insulating layer 208a may be used as a removal structure for removing blocking structure 220. In this regard, using ion implantation afterwards, the formation of the second doped region 226 (e.g. the source region) is self-aligned to the charge storing memory cell structure 212, since the ions only penetrate the substrate 202 through first insulating layer 204 in these locations, where the first insulating layer 204 is partially exposed by removing the blocking structure 220. The first doped region 222 is protected from the ions of the ion implantation to form the second doped region by the mask material 224.

The self-aligned formation of the doped regions in the substrate may improve the scalability of the charge storing memory cell. That means, fabricating smaller charge storing memory cells may be possible, since overlay errors during the formation the doped regions, e.g. second doped region 226 (e.g. the source region), may be reduced.

According to various embodiments, one or more implantation processes (e.g. fourth process 140 and sixth process 160 as described with reference to FIG. 1) using different energies (kinetic energies) for the dopant ions, different doses (area dose, dose rate), and/or various dopants (e.g. Arsenic, boron, phosphorus) may be carried out. Thus, the formation of doped regions having portions with different doping levels may be provided, the formation of doped regions having a gradient of the doping concentration may be provided and/or doped regions having a different type of doping may be provided.

Further, after an implantation process (e.g. fourth process 140 and sixth process 160) a recovery process, e.g. thermal annealing, e.g. recrystallization, may be carried out creating a recovered doped region (e.g. a drain region, e.g. a source region) in the substrate according to various embodiments.

Further, according to various embodiments, after finishing the second implantation process, the mask material 224 e.g. a resist (photoresist) and/or hard mask mask material (e.g. silicon oxide or silicon nitride or carbon) may completely be removed, e.g. by using photoresist stripping and/or etching.

As a result, applying method 100 for manufacturing a memory cell may enable the formation of asymmetrical S/D (source/drain) junctions without the need of additional masks. In more detail, the formation of the asymmetrical S/D junctions may include only one masking process related to the ion implantation, wherein the first doped region is protected during the formation of the second doped region. Asymmetrical split gate memory cells, asymmetrical regards to the doping distribution of the source and drain region, may be fabricated having benefits related to scalability, e.g. they may be subjected to an reduced implant damage to the select gate oxide resulting from implanting ions through the gate oxide due to the nature of spacer shape, wherein the spacer forms the select gate.

An aspect of various embodiments may be forming an LDD-junction, wherein the drain region proximate the select gate (e.g. spacer 218) may reduce the implant damage to the select gate, since no high dose implantation is carried out. Other benefits related to the scalability of a select gate flash memory cell may be to have more dopant atoms in the channel (channel boron) raising the threshold voltage ($V_{th}$) of the select gate cell while keeping low channel threshold voltage in the double poly flash cell.

Another aspect of various embodiments may be forming an asymmetrical source/drain junction without using additional masks. In one integration embodiment where periphery high-voltages and fast core logic devices are formed after the formation of flash memory cells, the peripheral areas may be essentially unformed at FIG. 2C after spacer 218 and blocking layers 220 were formed. The implant region 222 may therefore be formed without using additional masks.

According to various embodiments, modifications of the described method 100, as shown in FIG. 1 and exemplified in FIG. 2A to FIG. 2G, are disclosed in following description.

As an alternative embodiment, in analogy to method 100, as illustrated in FIG. 1 and described in FIG. 2A to FIG. 2G, an arrangement of charge storing memory cells may be fabricated, including two or more charge storing memory cell structures. According to various embodiments, two charge storing memory cell structures may be formed over the substrate 202 as exemplarily shown in FIG. 3A. According to various embodiments, the arrangement may be formed using a first process 110 (as already described), wherein two charge storing memory cell structures 212, 213 may be formed over the substrate 202 having a distance 315 as shown in FIG. 3A. According to an embodiment, the charge storing memory cell structures 212, 213 may be of the same type, e.g. a double poly stack respectively. Further, the charge storing memory cell structures 212, 213 may have a first sidewall 314, a second sidewall 316, a third sidewall 318, and a fourth sidewall 320. In analogy to method 100, an electrically conductive material may be deposited over the substrate 202 and the charge storing memory cell structures 212, 213 (see e.g. second process 120 shown in FIG. 1A and exemplified in the related description).

Figure 3B:
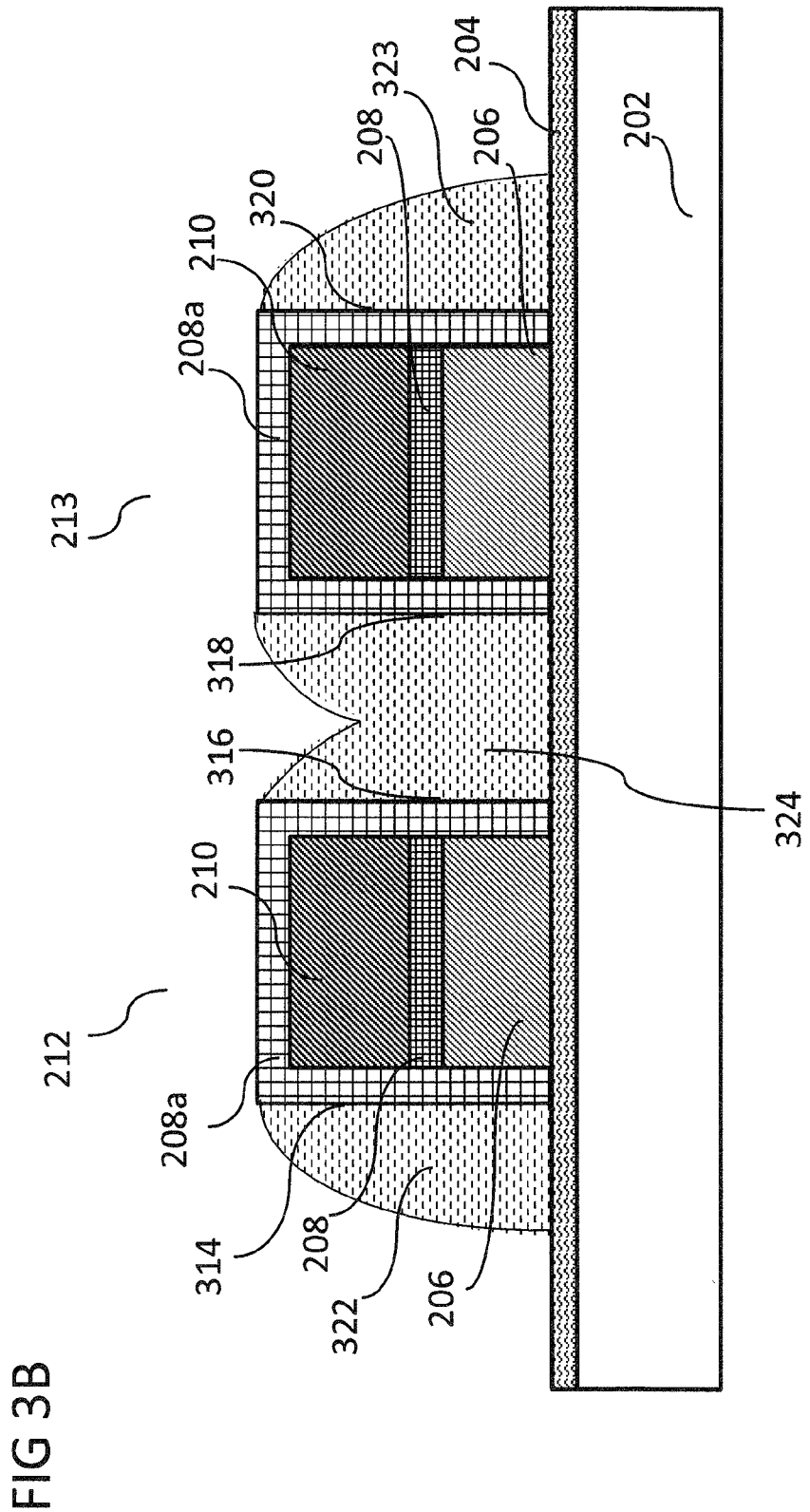
FIG. 3B schematically shows a cross section of a substrate at a processing stage, wherein two spacers and a blocking structure are formed at the sides of the charge storing memory cell structures, in analogy to FIG. 2C, in accordance with various embodiments.

Further, as illustrated in FIG. 3B, the electrically conductive layer may be patterned (see e.g. third process 130 shown in FIG. 1A and exemplified in the related description) forming a first spacer 322 at the first sidewall 314 of the first charge storing memory cell structure 212 and a second spacer 323 at the fourth sidewall 320 of the second charge storing memory cell structure 213 and a blocking structure 324 between the second sidewall 316 and the third sidewall 318 of the charge storing memory cell structures 212, 213. According to various embodiments, the distance 315 between the charge storing memory cell structures 212, 213 may be smaller than two times the thickness of the electrically conductive layer, which forms the spacers 322, 323 and the blocking structure 324 after patterning, so that one coherent blocking structure 324 is formed between the charge storing memory cell structures 212, 213, as it is illustrated in FIG. 3B. In the other case, if the distance 315 is larger than two times the thickness of the electrically conductive layer, two separated blocking structures may be formed between the charge storing memory cell structures 212, 213 (not illustrated).

Figure 3C:
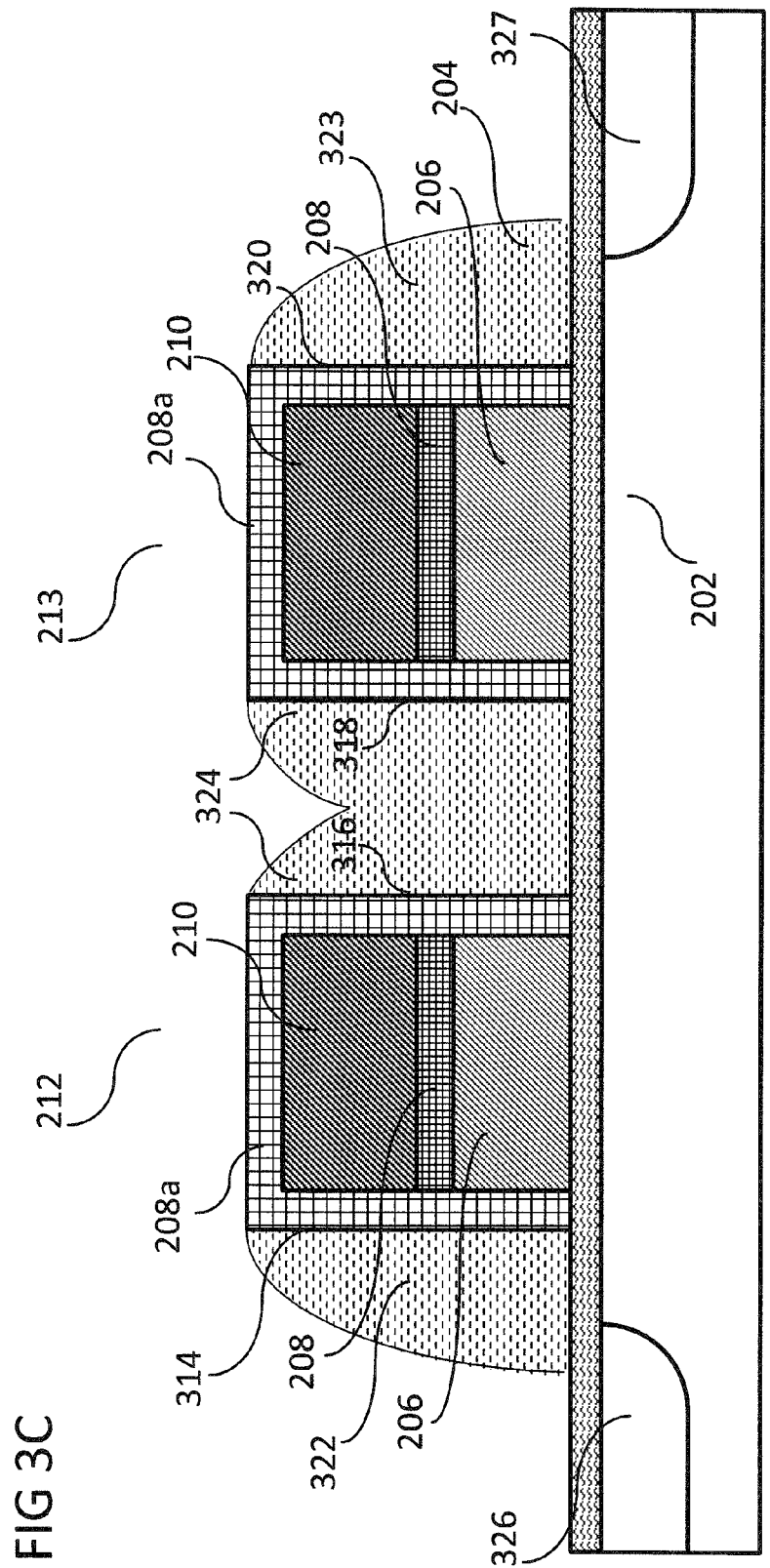
FIG. 3C schematically shows a cross section of a substrate at a processing stage, wherein the first doped region and the third doped region are created in the substrate, in analogy to FIG. 2D, in accordance with various embodiments.

Further, according to various embodiments, first dopant atoms may be implanted into the substrate 202, thereby forming a first doped region 326 in the substrate 202 proximate the first spacer 322 and a third doped region 327 proximate the second spacer 323, in analogy to fourth process 140 as described referring to method 100. As shown in FIG. 3C, a first dopant is implanted into the substrate 202, thereby forming the first and third doped regions 326, 327. According to various embodiments, the first doped region 326 may form a first drain region of the first charge storing memory cell structure 212 and the third doped region 327 may form the second drain region of the second charge storing memory cell structure 213. According to various embodiments, the formation of the first and third doped regions 326, 327 (e.g. the drain regions) may be achieved without using a masking process, which may reduce the number of required processes Furthermore, according to various embodiments, the formation of the first and third doped regions 326, 327 (e.g. the drain regions) may be self-aligned to the spacer, since no masking process may be necessary, which may improve the scalability of the charge storing memory cell. The blocking structure 324 may serve as mask material during the formation of the first and third doped regions 326, 327.

Figure 3D:
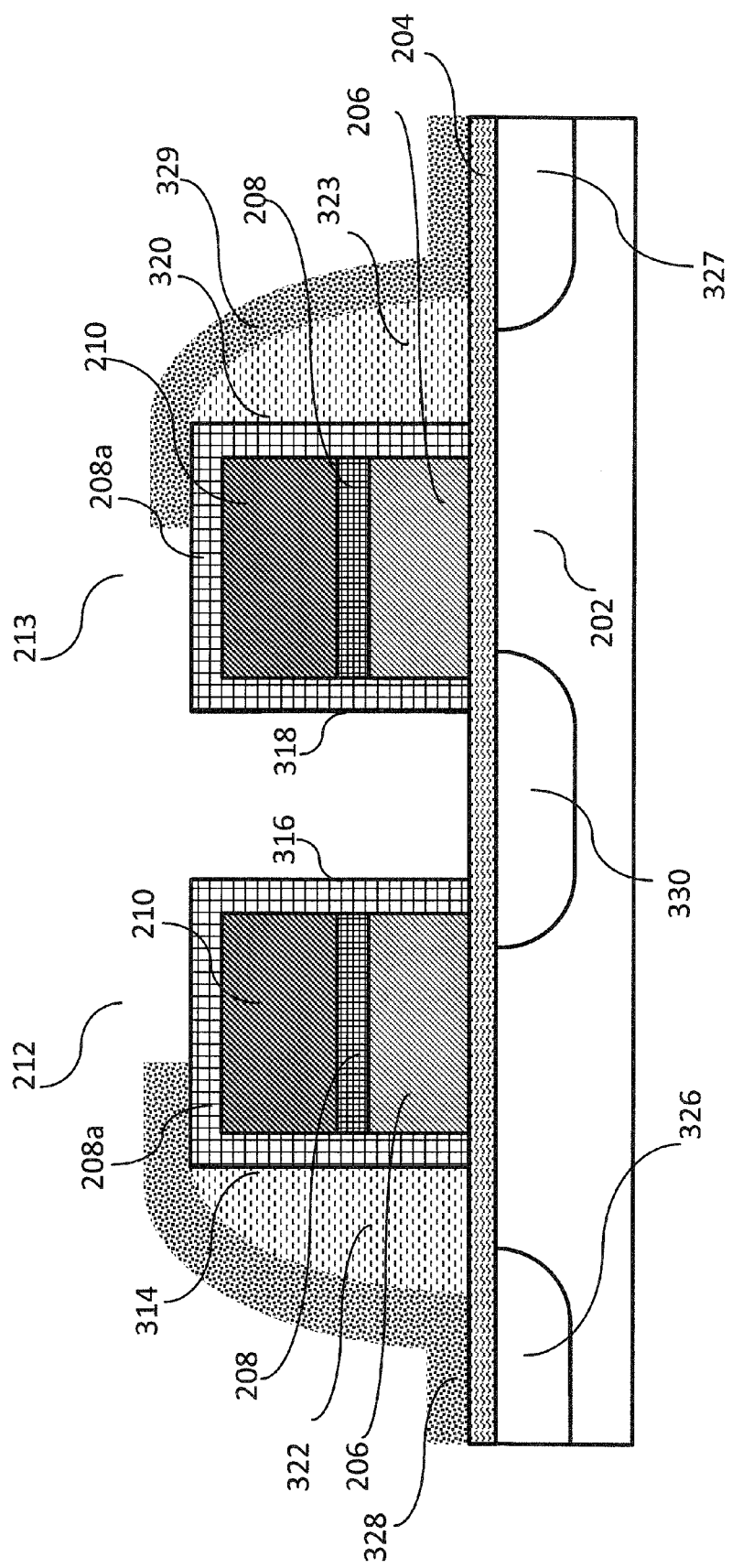
FIG. 3D schematically shows a cross section of a substrate at a processing stage, wherein the second doped region is created in the substrate after having removed the blocking structure, in analogy to FIG. 2E, FIG. 2F, and FIG. 2G, in accordance with various embodiments.

Further, according to various embodiments, after having removed the blocking structure 324 (see e.g. fifth process 150 shown in FIG. 1A and exemplified in the related description) second dopant atoms may be implanted into the substrate 202, thereby forming the second doped region in the substrate 202 proximate the second sidewall 318 of the first charge storing memory cell structure 212 and the third sidewall 320 of the second charge storing memory cell structure 213. As shown in FIG. 3D, a second dopant is implanted into the substrate 202, thereby forming the second doped region 330. Before removing the blocking structure 324, mask material 328, 329 may be applied protecting the first and second spacers 322, 323 and the first and third doped regions 326, 327 during the removal process of the blocking structure 324, thereby forming a removal mask. According to various embodiments, the second doped region 330 may form the source region of the charge storing memory cell structures 212, 213. According to various embodiments, the second doped region 330 (e.g. the source region) may be a p-type or an n-type doped region. According to various embodiments, the third insulating layer 208a and the mask material 328, 329 may be used as the removal mask for removing blocking structure 324. In this regard, according to various embodiments, using ion implantation afterwards, the formation of the second doped region 330 (e.g. the source region) is self-aligned to the first and second charge storing memory cell structure 212, 213, since the ions may only penetrate the substrate 202 through the first insulating layer 204 at these locations, where the first insulating layer 204 is partially exposed (exposed to the environment, which means that ions may have a direct access to the surface of first insulating layer 204) by removing the blocking structure 324. This may improve the scalability of the charge storing memory cell. This means, according to various embodiments, fabricating smaller charge storing memory cells may be possible, since overlay errors during the formation the doped regions, e.g. second doped region 330 (e.g. the source region), may be reduced. In other words, fabricating charge storing memory cells having a smaller pitch or feature size compared to conventional fabrication processes may be more convenient using self-aligned processes as described herein.

According to various embodiments, the first and second charge storing memory cell structures 212, 213 may use the same (share) second doped region 330 as source region.

According to various embodiments, the second doped region 330 (e.g. the source region) may have a higher doping level then the first and third doped regions 326, 327 (e.g. the drain region), which implies that an asymmetrical charge storing memory cell may be provided. Referring to this, an asymmetrical split gate charge storing memory cell may be provided, wherein the charge storing memory cell may be a floating gate based memory cell.

Figure 4:
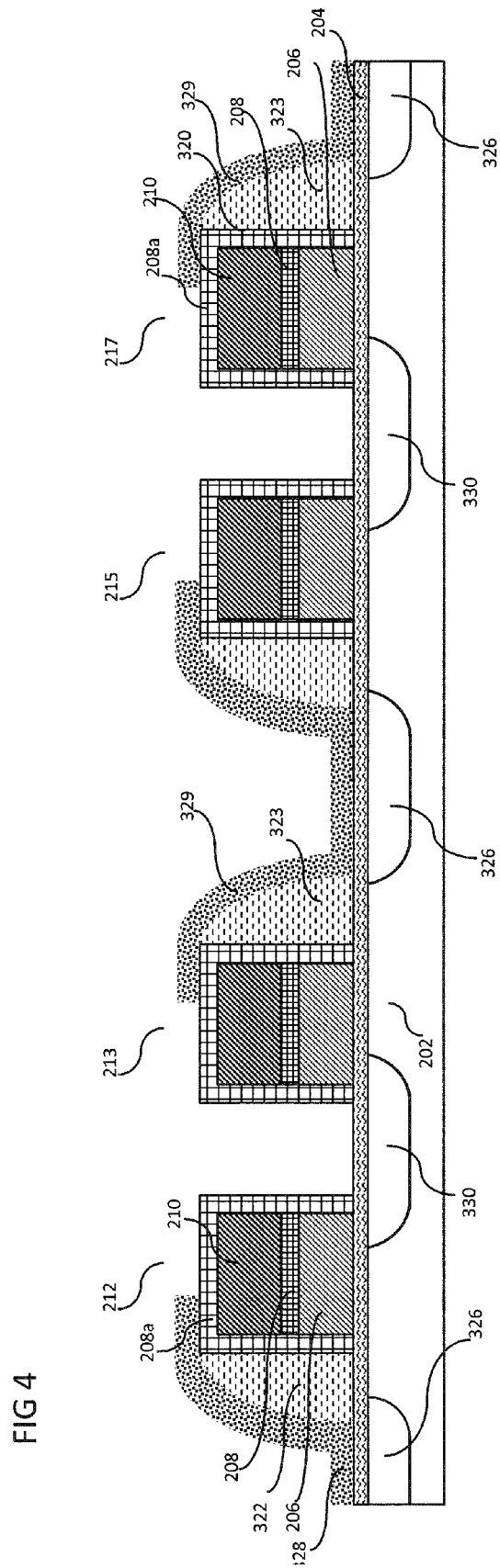
FIG. 4 schematically shows a cross section of a substrate at a final processing stage, wherein the plurality of charge storing memory cells, a memory cell arrangement, is formed over the substrate, in analogy to FIG. 2G and FIG. 3D in accordance with various embodiments.

According to various embodiments, more than two charge storing memory cell structures may be formed over the substrate, forming a memory cell arrangement. As shown in FIG. 4, an array of charge storing memory cells may be fabricated using method 100, as already described. Thus, a plurality of charge storing memory cell structures 212, 213, 215, 217 forming a memory cell arrangement, e.g. the charge storing memory cell arrangement, wherein two adjacent charge storing memory cell structures respectively (e.g. 212 and 213 or e.g. 215 and 217) using the same second doped region 330 (e.g. as source region) (see e.g. FIG. 3D and the related description). At the same time, two adjacent charge storing memory cell structures respectively (e.g. 213 and 215) using the same first doped region 326 (e.g. as drain region). It should be noted that the schematic illustration in FIG. 4 shows only a part of such a charge storing memory cell arrangement. According to various embodiments, the arrangement of the charge storing memory cell structures, as shown in FIG. 4, may be continuously formed over a desired region of the substrate 202. Due to symmetry, the first doped regions 326 and the second doped regions 330 have a common reference sign respectively, and in order to provide a comprehensive view, symmetrically aligned equal elements may have no reference sign, regarding FIG. 4.

According to various embodiments, after having fabricated the charge storing memory cell structure, and after having formed the doped regions in the substrate (see e.g. FIG. 2G, FIG. 3D, and FIG. 4) the remaining mask material 224, 328, 329 may be removed. If for example photoresist may be used, a photoresist stripping process may be carried out, according to various embodiments. Further, according to various embodiments, electrical contacts may be provided, which may electrically contacting the doped regions (e.g. the first doped regions and the second doped regions, e.g. the source regions and drain regions of the memory cell arrangement).

According to various embodiments, the first doped regions 222, 326, 327 may form the source region and the second doped regions 226, 330 may form the drain region of a junction, wherein the junction is a part of a charge storing memory cell (see e.g. FIG. 2G, FIG. 3D and FIG. 4).

It should be noted that the at least one of the doping level, the type of doping (p-type or n-type) and the doping distribution in the first doped regions and in the second doped regions may be configured independently from each other, e.g. may be provided being asymmetrically regarding the source regions and the drain regions, according to various embodiments. Additionally, the asymmetrical source regions and the drain regions may be provided without the need of several masking processes, according to various embodiments.

Moreover, since the formation of first doped regions and second doped regions may be self-aligned to the spacer and the blocking structure, in accordance with various embodiments, a beneficial behavior regarding the scalability of the memory cells results from applying method 100 to create a memory cell or a memory cell arrangement (e.g. a charge storing memory cell or a charge storing memory cell arrangement). Further, due to the nature of the spacer shape (c.f. FIG. 2D, FIG. 3C and FIG. 4) the implant damage to the first insulating layer 204 (e.g. the select gate oxide) resulting from implanting ions through the first insulating layer 204 may be reduced.

The following part of the description refers inter alia to the precedent figures and the accompanying descriptions, but the description is not limited to the precedent figures and the accompanying descriptions and therefore no reference signs are used.

According to various embodiments, at least the first doped region in the substrate may be masked before implanting the second dopant atoms.

According to various embodiments, the electrically conductive layer may include polysilicon.

According to various embodiments, the charge storing memory cell structure may be a floating gate memory cell structure.

According to various embodiments, the floating gate memory cell structure may include a floating gate and a control gate disposed over the floating gate.

According to various embodiments, the floating gate may include polysilicon.

According to various embodiments, the control gate may include polysilicon.

According to various embodiments, the charge storing memory cell structure may be a charge trapping memory cell structure. Further, the charge trapping memory cell structure may include a charge trapping layer and a control gate disposed over the charge trapping layer. Further, according to various embodiments, the charge trapping layer may include a first oxide layer, a nitride layer disposed over the first oxide layer, and a second oxide layer disposed over the nitride layer. Moreover, the control gate may include polysilicon.

According to various embodiments, at least one spacer may be configured as a select gate.

According to various embodiments, a mask material may be deposited over the substrate and the charge storing memory cell structure. Further the mask material may be patterned to form a patterned mask layer. Moreover, the blocking structure may be at using the patterned mask layer as an etch mask.

According to various embodiments, implanting the second dopant atoms may include using the patterned mask layer as an implantation mask.

According to various embodiments, the blocking structure may have a thickness in the range from about 50 nm to about 200 nm.

According to various embodiments, the blocking structure may have a thickness of about 100 nm.

According to various embodiments, the blocking structure may have a thickness of at least 80 nm.

According to various embodiments, the first doped region may be aligned to the at least one spacer.

According to various embodiments, implanting the first and second dopant atoms may include implanting the first dopant atoms with an implant dose that is different from an implant dose of the second dopant atoms.

According to various embodiments, implanting the first and second dopant atoms may include implanting the first dopant atoms with an implant dose that is lower than an implant dose of the second dopant atoms.

According to various embodiments, implanting the first dopant atoms may include implanting the first dopant atoms with an implant dose in the range from about $10^{13}$ cm$^{-2}$ to about $10^{15}$ cm$^{-2}$.

According to various embodiments, implanting the second dopant atoms may include implanting the second dopant atoms with an implant dose in the range from about $10^{13}$ cm$^{-2}$ to about $10^{15}$ cm$^{-2}$.

According to various embodiments, implanting the first and second dopant atoms may include implanting the first dopant atoms with an implant energy that is different from an implant energy of the second dopant atoms.

According to various embodiments, implanting the first and second dopant atoms may include implanting the first dopant atoms with an implant energy that is lower than an implant energy of the second dopant atoms.

According to various embodiments, implanting the first dopant atoms may include implanting the first dopant atoms with an implant energy in the range from about 2 keV to about 15 keV, for example in case of the first dopant atoms being p-type dopant atoms.

According to various embodiments, implanting the second dopant atoms may include implanting the second dopant atoms with an implant energy in the range from about 10 keV to about 20 keV, for example in case of the second dopant atoms being p-type dopant atoms.

According to various embodiments, implanting the first and second dopant atoms may include implanting the first and second dopant atoms such that the first doped region may differ from the second doped region in at least one of doping profile and doping concentration.

According to various embodiments, at least one doped region (e.g. the drain region and/or the source region) may include a plurality of areas respectively, wherein the areas may differ in at least one of the doping type (p-type or n-type), the doping concentration, the dose, and the shape of the doped region or area.

According to various embodiments, depositing the electrically conductive layer may include a conformal deposition process.

According to various embodiments, patterning the electrically conductive layer may include etching the electrically conductive layer.

According to various embodiments, etching the electrically conductive layer may include an anisotropic etch process.

According to various embodiments, etching the electrically conductive layer may include a dry etch process.

According to various embodiments, the first doped region may include a first source/drain region and the second doped region may include a second source/drain region.

According to various embodiments, the first source/drain region may be a drain region and the second source/drain region may be a source region.

According to various embodiments, forming at least one charge storing memory cell structure may include forming a first charge storing memory cell structure and a second charge storing memory cell structure over the substrate. Thereby, the first and second charge storing memory cell structures may each have a first sidewall and a second sidewall opposite to the first sidewall, wherein the second sidewall of the second charge storing memory cell structure facing the second sidewall of the first charge storing memory cell structure.

According to various embodiments, depositing an electrically conductive layer may include depositing the electrically conductive layer over the first and second charge storing memory cell structures and between the first and second charge storing memory cell structures.

According to various embodiments, patterning the electrically conductive layer may include patterning the electrically conductive layer such that a first spacer may be formed at the first sidewall of the first charge storing memory cell structure, a second spacer may be formed at the first sidewall of the second charge storing memory cell structure, and the blocking structure may be formed between the first and second charge storing memory cell structures.

According to various embodiments, implanting first dopant atoms may include implanting the first dopant atoms such that the first doped region may be formed in the substrate proximate the first spacer and a third doped region may be formed in the substrate proximate the second spacer.

According to various embodiments, the blocking structure may cover the substrate between the first and second charge storing memory cell structures.

According to various embodiments, the first doped region may include a first source/drain region, the second doped region may include a second source/drain region, and the third doped region may include a third source/drain region.

According to various embodiments, the first source/drain region may be a first drain region, the second source/drain region may be a source region, and the third source/drain region may be a second drain region.

According to various embodiments, a method for manufacturing a memory cell, may include: Forming a floating gate memory cell structure over a substrate; depositing a polysilicon layer; etching the polysilicon layer such that a spacer select gate is formed at a first sidewall of the floating gate memory cell structure and a blocking structure is formed at a second sidewall of the floating gate storing memory cell structure opposite the first sidewall and implanting first dopant atoms such that a first source/drain region is formed in the substrate proximate to the spacer, wherein the first dopant atoms are blocked by the blocking structure; etching the polysilicon layer such that the blocking structure is removed; implanting second dopant atoms such that a second source/drain region is formed in the substrate proximate the second sidewall of the floating gate memory cell structure.

According to various embodiments, implanting the first and second dopant atoms may include implanting the first dopant atoms with a different implant dose or energy, or both, than the second dopant atoms.

According to various embodiments, implanting the first and second dopant atoms may include implanting the first and second dopant atoms such that the first doped region differs from the second doped region in at least one of doping profile and doping concentration.

According to various embodiments, method for manufacturing a memory cell, may include: Forming a charge storing memory cell structure over a substrate; depositing a select gate layer; patterning the select gate layer such that a select gate is formed at one sidewall of the charge storing memory cell structure and a blocking structure is formed at an opposite sidewall of the charge storing memory cell structure; implanting first dopant atoms such that a first doped region is formed in the substrate proximate the select gate, wherein the first dopant atoms are blocked by the blocking structure; removing the blocking structure; masking the first doped region; implanting second dopant atoms such that a second doped region is formed in the substrate proximate the second sidewall of the charge storing memory cell structure, wherein implanting the first and second dopant atoms may include implanting the first dopant atoms with a lower implant dose or energy, or both, than the second dopant atoms.

According to various embodiments, a method for manufacturing a memory cell arrangement, may include: Forming first and second charge storing memory cell structures over a substrate, each of the first and second charge storing memory cell structures may have a first sidewall and a second sidewall opposite the first sidewall, the second sidewall of the first charge storing memory cell structure facing the second sidewall of the second charge storing memory cell structure; depositing an electrically conductive layer over the substrate and the first and second charge storing memory cell structures; patterning the electrically conductive layer to form a first spacer at the first sidewall of the first charge storing memory cell structures and a second spacer at the first sidewall of the second charge storing memory cell structure and a blocking structure between the first and second charge storing memory cell structures; implanting first dopant atoms to form a first doped region in the substrate proximate the first spacer and a third doped region in the substrate proximate the second spacer, wherein the first dopant atoms are blocked by the blocking structure; removing the blocking structure after implanting the first dopant atoms; implanting second dopant atoms to form a second doped region in the substrate between the first and second charge storing memory cell structures.

According to various embodiments, at least the first and third doped regions in the substrate may be masked before implanting the second dopant atoms.

According to various embodiments, implanting the first and second dopant atoms may include implanting the first and second dopant atoms such that the first and third doped regions differ from the second doped region in at least one of doping profile and doping concentration.

According to various embodiments, the first doped region may be configured as a first source/drain region of a first memory cell of the memory cell arrangement, the third doped region may be configured as a first source/drain region of a second memory cell of the memory cell arrangement, and the second doped region may be configured as a common second source/drain region of the first and second memory cells of the memory cell arrangement.

According to various embodiments, a memory cell may include: a charge storing memory cell structure disposed over a substrate; an electrically conductive spacer at a first sidewall of the charge storing memory cell structure; a first source/drain region in the substrate proximate the spacer; a second source/drain region in the substrate proximate the second sidewall of the charge storing memory cell structure, wherein the first and second source/drain regions have different doping profiles.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing at least one memory cell, comprising:
    forming at least one charge storing memory cell structure over a substrate, the charge storing memory cell structure having a first sidewall and a second sidewall opposite the first sidewall;
    depositing an electrically conductive layer over the substrate and the charge storing memory cell structure;
    patterning the electrically conductive layer to form a spacer at the first sidewall of the charge storing memory cell structure and a blocking structure at the second sidewall of the charge storing memory cell structure;
    implanting first dopant atoms to form a first doped region in the substrate proximate the spacer, wherein the first dopant atoms are blocked by the blocking structure;
    removing the blocking structure after implanting the first dopant atoms;
    implanting second dopant atoms to form a second doped region in the substrate proximate the second sidewall of the charge storing memory cell structure.

2. The method of claim 1, further comprising:
    masking at least the first doped region in the substrate before implanting the second dopant atoms.

3. The method of claim 1,
    wherein the electrically conductive layer comprises polysilicon.

4. The method of claim 1,
    wherein the charge storing memory cell structure is a floating gate memory cell structure.

5. The method of claim 1,
    further comprising configuring the at least one spacer as a select gate.

6. The method of claim 1, wherein removing the blocking structure comprises:
    depositing a mask material over the substrate and the charge storing memory cell structure;
    patterning the mask material to form a patterned mask layer;
    etching the blocking structure using the patterned mask layer as an etch mask.

7. The method of claim 6,
    wherein implanting the second dopant atoms comprises using the patterned mask layer as an implantation mask.

8. The method of claim 1,
    wherein the blocking structure has a thickness in the range from about 50 nm to about 200 nm.

9. The method of claim 1, wherein implanting the first and second dopant atoms comprises implanting the first dopant atoms with an implant dose that is different from an implant dose of the second dopant atoms.

10. The method of claim 1, wherein implanting the first and second dopant atoms comprises implanting the first dopant atoms with an implant dose that is lower than an implant dose of the second dopant atoms.

11. The method of claim 1, wherein implanting the first and second dopant atoms comprises implanting the first dopant atoms with an implant energy that is different from an implant energy of the second dopant atoms.

12. The method of claim 1, wherein implanting the first and second dopant atoms comprises implanting the first dopant atoms with an implant energy that is lower than an implant energy of the second dopant atoms.

13. The method of claim 1, wherein implanting the first and second dopant atoms comprises implanting the first and second dopant atoms such that the first doped region differs from the second doped region in at least one of doping profile and doping concentration.

14. The method of claim 1, wherein patterning the electrically conductive layer comprises etching the electrically conductive layer.

15. The method of claim 1, wherein the first doped region comprises a first source/drain region and the second doped region comprises a second source/drain region.

16. The method of claim 1, further comprising:
wherein forming at least one charge storing memory cell structure comprises forming a first charge storing memory cell structure and a second charge storing memory cell structure over the substrate, the first and second charge storing memory cell structures each having a first sidewall and a second sidewall opposite to the first sidewall, the second sidewall of the second charge storing memory cell structure facing the second sidewall of the first charge storing memory cell structure;
wherein depositing an electrically conductive layer comprises depositing the electrically conductive layer over the first and second charge storing memory cell structures and between the first and second charge storing memory cell structures;
wherein patterning the electrically conductive layer comprises patterning the electrically conductive layer such that a first spacer is formed at the first sidewall of the first charge storing memory cell structure, a second spacer is formed at the first sidewall of the second charge storing memory cell structure, and the blocking structure is formed between the first and second charge storing memory cell structures;
wherein implanting first dopant atoms comprises implanting the first dopant atoms such that the first doped region is formed in the substrate proximate the first spacer and a third doped region is formed in the substrate proximate the second spacer.

17. The method of claim 16, wherein the first doped region comprises a first source/drain region, the second doped region comprises a second source/drain region, and the third doped region comprises a third source/drain region.

18. A method for manufacturing a memory cell, comprising:
forming a floating gate memory cell structure over a substrate;
depositing a polysilicon layer;
etching the polysilicon layer such that a spacer select gate is formed at a first sidewall of the floating gate memory cell structure and a blocking structure is formed at a second sidewall of the floating gate storing memory cell structure opposite the first sidewall;
implanting first dopant atoms such that a first source/drain region is formed in the substrate proximate to the spacer, wherein the first dopant atoms are blocked by the blocking structure;
etching the polysilicon layer such that the blocking structure is removed;
implanting second dopant atoms such that a second source/drain region is formed in the substrate proximate the second sidewall of the floating gate memory cell structure.

19. The method of claim 18, wherein implanting the first and second dopant atoms comprises implanting the first dopant atoms with a different implant dose or energy, or both, than the second dopant atoms.

20. The method of claim 18, wherein implanting the first and second dopant atoms comprises implanting the first and second dopant atoms such that the first doped region differs from the second doped region in at least one of doping profile and doping concentration.

21. A method for manufacturing a memory cell arrangement, comprising:
forming first and second charge storing memory cell structures over a substrate,
each of the first and second charge storing memory cell structures having a first sidewall and a second sidewall opposite the first sidewall, the second sidewall of the first charge storing memory cell structure facing the second sidewall of the second charge storing memory cell structure;
depositing an electrically conductive layer over the substrate and the first and second charge storing memory cell structures;
patterning the electrically conductive layer to form a first spacer at the first sidewall of the first charge storing memory cell structures and a second spacer at the first sidewall of the second charge storing memory cell structure and a blocking structure between the first and second charge storing memory cell structures;
implanting first dopant atoms to form a first doped region in the substrate proximate the first spacer and a third doped region in the substrate proximate the second spacer, wherein the first dopant atoms are blocked by the blocking structure;
removing the blocking structure after implanting the first dopant atoms;
implanting second dopant atoms to form a second doped region in the substrate between the first and second charge storing memory cell structures.

22. The method of claim 21, further comprising:
masking at least the first and third doped regions in the substrate before implanting the second dopant atoms.

23. The method of claim 21, wherein implanting the first and second dopant atoms comprises implanting the first and second dopant atoms such that the first and third doped regions differ from the second doped region in at least one of doping profile and doping concentration.

24. The method of claim 21, wherein the first doped region is configured as a first source/drain region of a first memory cell of the memory cell arrangement,
the third doped region is configured as a first source/drain region of a second memory cell of the memory cell arrangement, and the second doped region is configured as a common second source/drain region of the first and second memory cells of the memory cell arrangement.

* * * * *